(12) United States Patent
Guglhoer

(10) Patent No.: US 7,018,243 B2
(45) Date of Patent: Mar. 28, 2006

(54) CONNECTOR

(75) Inventor: Thomas Guglhoer, Halblech (DE)

(73) Assignee: EPT GmbH & Co. KG, Peiting (DE)

( * ) Notice: Subject to any disclaimer, the term of this patent is extended or adjusted under 35 U.S.C. 154(b) by 0 days.

(21) Appl. No.: 10/433,971

(22) PCT Filed: Dec. 5, 2001

(86) PCT No.: PCT/DE01/04572

§ 371 (c)(1),
(2), (4) Date: Nov. 26, 2003

(87) PCT Pub. No.: WO02/47208

PCT Pub. Date: Jun. 13, 2002

(65) Prior Publication Data

US 2004/0077192 A1    Apr. 22, 2004

(30) Foreign Application Priority Data

Dec. 6, 2000   (DE) ................ 100 60 978
Jun. 21, 2001   (DE) ................ 101 29 482

(51) Int. Cl.
*H01R 13/502*   (2006.01)

(52) U.S. Cl. ................ 439/701; 439/79

(58) Field of Classification Search ........ 439/607, 439/608, 79, 701, 609, 709, 712, 715, 717, 439/722

See application file for complete search history.

(56) References Cited

U.S. PATENT DOCUMENTS

| | | | | |
|---|---|---|---|---|
| 3,539,974 A | | 11/1970 | Berg | 339/157 |
| 5,104,341 A | * | 4/1992 | Gilissen et al. | 439/608 |
| 5,496,183 A | * | 3/1996 | Soes et al. | 439/79 |
| 5,664,968 A | * | 9/1997 | Mickievicz | 439/608 |
| 5,924,899 A | * | 7/1999 | Paagman | 439/701 |
| 6,041,498 A | | 3/2000 | Hillbish et al. | 29/883 |
| 6,102,747 A | * | 8/2000 | Paagman | 439/701 |
| 6,312,287 B1 | * | 11/2001 | Harting et al. | 439/581 |

FOREIGN PATENT DOCUMENTS

| | | |
|---|---|---|
| EP | 0 638 967 A2 | 7/1994 |
| EP | 0 930 812 A2 | 1/1999 |
| EP | 1 018 784 A1 | 7/2000 |
| EP | 1 083 630 A1 | 3/2001 |
| FR | 2 786 931 | 12/1999 |
| JP | 2000113928 A | 4/2000 |
| WO | WO 97/40555 | 10/1997 |

\* cited by examiner

*Primary Examiner*—Briggitte R. Hammond
(74) *Attorney, Agent, or Firm*—Boyle Fredrickson Newholm Stein & Gratz S.C.

(57) ABSTRACT

What is disclosed is a plug-in connector in through-hole technology that is suited for the surface soldering technique. The plug-in connector includes an insulating carrier part wherein a multiplicity of wafers each having soldering tags and contact terminals are inserted. In accordance with the invention, the wafers are placed at a distance from each other, whereby flow channels for supplying the heat transport medium, e.g. air, are created. In an advantageous alternative or additional development of the invention, there is formed in the range of the feedthrough a flow space permitting a flow of the heat transport medium perpendicularly to the plane of the platelets. This passage may be formed by a recess of the insulating material or by suitable spacer elements.

13 Claims, 11 Drawing Sheets

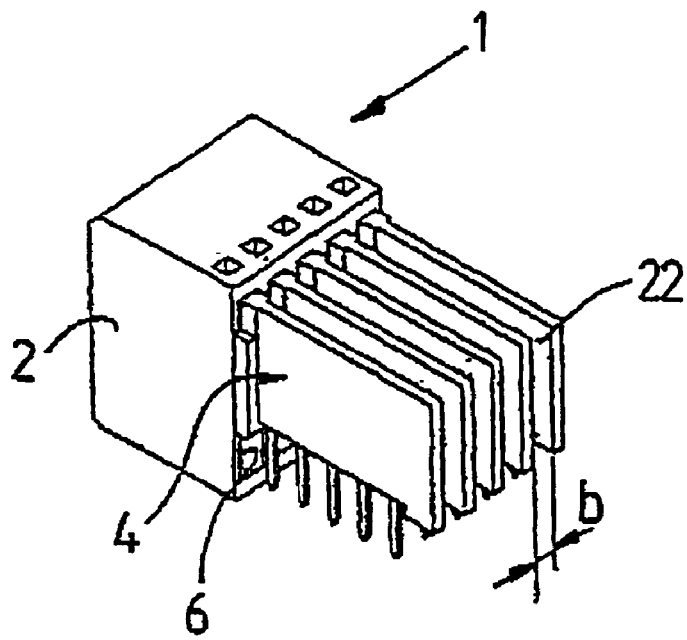
Fig. 1
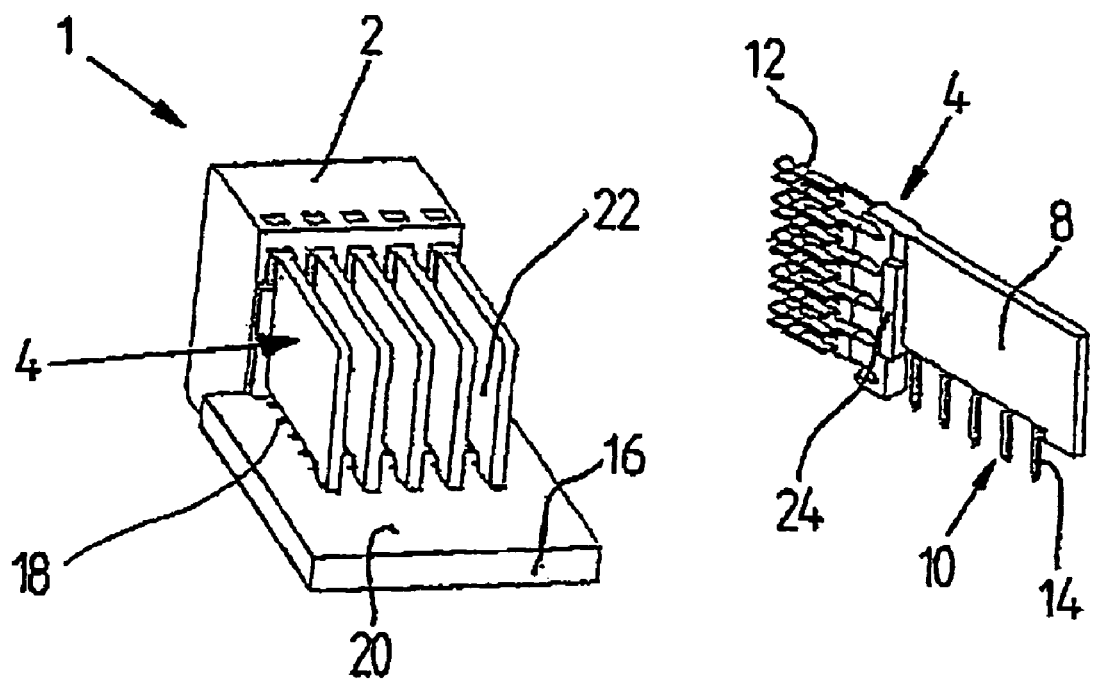
Fig. 2
Fig. 3

CONNECTOR

BACKGROUND OF THE INVENTION

1. Field of the Invention

The invention relates to an electrical plug-in connector in accordance with the preamble of claim 1.

2. Description of the Related Art

Plug-in connectors generally serve for electrical connection between electrical components or electrical circuits. In electronics, circuit boards as circuit carriers have attained outstanding significance. With the aid of electrical plug-in connectors a reliable, generally releasable electrical connection between circuit carriers mostly being planar circuit boards may be established. The circuit board-side terminals of plug-in connectors are designed such that through suitable processing methods a secure electrical and mechanical connection may be produced between these plug-in connector terminals and, the circuit board. Processes to be mentioned here are the classical flow-soldering technique, the surface soldering technique (≈SMT=surface mount technology) and the press-fitting technique. In the cases of flow-soldering method and press-fitting technique the plug-in connector terminal is introduced into a feedthrough. This is referred to as through-hole technology. A feedthrough is part of the circuit located on the circuit board and consists of a bore in the circuit board material that is covered with conductive material and customarily arranged at right angles with the circuit board surface.

The flow soldering method takes the circuit board having—besides other electronic components—one or several plug-in connectors pre-mounted on it over a stationary wave of flowing, liquid solder. The solder consists of a tin alloy heated above melting point. As the bottom side of the circuit board with the soldering tags of the plug-in connectors slightly protruding from the feedthroughs thereof contacts the liquid solder, the solder is drawn into the feedthrough by capillary action and subsequently by cooling becomes a connection having mechanical strength and good electrical conductivity.

The surface soldering technique is a related process which does, however, customarily not utilize feedthroughs. Circuit boards in surface technique include conductor paths of copper forming part of the circuit board's circuitry. The ends of such paths are geometrically designed for the surface soldering technique such that a corresponding electronic or electro-mechanical component adapted for the surface soldering technique may match these path ends with its connecting pads. Prior to mounting of the surface mounting components, the ends of the conduction paths are coated with a highly viscous, sticky solder paste by means of a screen printing method, which solder paste is capable of sufficient mechanical immobilization of the subsequently applied component until the surface soldering process is performed. The solder paste is composed of very small solder globules consisting of a tin alloy with a sticky additive that ensures adhesion of the surface mounting element on the circuit board until the soldering process, and further additives intended to improve operability. As a result of the heat supplied to the soldering location during the surface soldering process, the scolder paste melts and in the subsequent cooling process forms a mechanically stable soldered joint with good electrical conductivity between component terminal and conduction path. The adhesive and the additives added to the solder paste evaporate in the process. Heat transport to the soldering location in the surface soldering process is alternatively effected through various techniques, such as by infrared radiation or by convection. The convection soldering process has attained the highest significance in this field.

For components having larger dimensions or a higher weight, such as for instance plug-in connectors, the combination of surface soldering technique and flow soldering method is employed. Here the feedthroughs already known from the flow soldering method are introduced into the circuit board for these components in addition to the surface soldering terminations. These feedthroughs are coated by the printing process customary for the surface soldering technique. If proceeding in a suitable manner, the solder paste is applied not only onto the feedthrough but also pressed into it. Following pre-mounting of the component, both the component soldering terminations and the solder paste are then located in the feedthrough.

Patent specification EP 0 422 785 B1 shows a plug-in connector constructed of a plurality of wafers sequentially carrying the electrical contacts, and a carrier insulating body. The terminals are realized in press-fitting technique. Document EP 0 638 967 A2 shows a similar design where the circuit board terminals are executed in press-fitting technique. U.S. Pat. No. 3,539,974 shows a plug-in connector assembly constructed of wafers manufactured of insulating material and conductive elements integrated into these wafers. The terminals of this plug-in connection are suited for the flow soldering method.

The advantage of realizing the above mentioned plug-in connector designs is the high mechanical stability of the plug-in connector and the positional accuracy of the soldering tags which is ensured by the fact that the soldering tag is routed through its sheath through insulating material as far as to the soldering location.

The just-mentioned plug-in connectors do, however, exhibit essential drawbacks for the surface soldering process. The named solutions do not, or only insufficiently, allow the supply of a sufficient amount of heat to the soldering location in the short time available for the surface soldering process.

SUMMARY OF THE PRESENT INVENTION

The invention is based on the object of developing a plug-in connector of the construction in wafer design as described at the outset and through-hole technology, which has the property of being suited for the surface soldering process.

This object is attained through a plug-in connector having the features of claim 1.

In accordance with the invention, the plug-in connector has an insulating carrier part wherein a multiplicity of wafers arranged side by side are inserted, in the insulating material of which contact elements are embedded. Between the wafers inserted into the carrier part there remains in accordance with the invention a gap which is formed such that during the surface soldering process a sufficient heat transport to the soldering spot may be developed, whether by convection or by radiation. In the conventional solutions the insulating discs are flushly contiguous, so that the formation of such a heat flow from the environment to the soldering location is practically prevented. Thanks to the solution in accordance with the invention it becomes possible to heat the soldering location, i.e. the feedthrough, the soldering tag, and the solder paste during the surface soldering process to such an extent that the solder paste melts, and entering into the annular gap between soldering tag and feedthrough becomes possible even in the short period available in the surface soldering process.

In an advantageous development of the invention, the wafers have spacers in the range of the feedthrough, so that the contact elements—or their soldering tags, to be more precise—extend in the range between insulating material and the electrical circuitry, more particularly, in accordance with the invention the insulating material of the wafers is exposed in the range of the feedthrough to result in an open range between the insulation body of the plug-in connector and circuit board, which permits a heat flow of the medium employed for heating in the direction normal to the orientation of the wafers. Herein the position of the wafers relative to the plug-in connector is secured, for the soldering tags are received in the feedthroughs. The spacers act as support points for the respective wafer and are selected such that the position of the plug-in connector relative to the electrical circuit (circuit board) is reproducible.

These spacers may be formed by projections of the insulating material or by corresponding formation of the contact elements. Due to the formation of these spacers and the gap between two adjacent wafers, the soldering tags, the feedthrough and the solder paste received therein as so well accessible for heat transport during the surface soldering process accessible to permit the formation of a reliable soldered joint without having to do away with reproducible positioning of the plug-in connector relative to the circuit board.

Thermal conduction in the range of the soldering tags may be further improved if the insulating material is provided with recesses extending in portions along the contact elements while partly exposing the latter, so that those portions of the contact elements adjacent the soldering location may also directly be heated by convection of radiation. In this way, a maximum heat exchange area for transmission of the heat introduced from outside to the soldering location is created. The recesses are, however, selected such that mechanical fixation of the contact elements in the insulating material will be ensured at any point of time. Overall, in this embodiment operability of the soldering tags is enhanced by their increased heat exchange area, while the mechanical stability of the plug-in connector is reduced only inessentially.

Relative positioning of the plug-in connection with regard to the electrical circuit may be further improved if the wafer is designed to include a retainer member capable of being taken into engagement with a correspondingly shaped mating part on the circuit board. This retainer member may, e.g., be a snap-in or catch protrusion on the insulation part which snaps into frictional or positive engagement e.g. with a press-fit in a recess of the circuit. As an alternative, or in addition, the retainer member may also be executed through a suitable design of the soldering tags, such as by denting at least one soldering tag.

Thanks to the retainer member, the position of the plug-in connector relative to the circuit board during the soldering process is additionally stabilized, and faulty positioning which might later on result in a useless completed circuit board is avoided. This is particularly advantageous inasmuch as surface-mounting components are as a general rule pre-mounted on the circuit board by automated machines, and only then supplied to the soldering process. In this case the maximum setting force whereby such an automated machine can set a component on the circuit board or in the feedthrough, is comparatively low. The retainer members then are to be designed such that the setting force inevitably required by these will not be higher than the maximum force which the pick-and-place machines may customarily apply.

In a preferred practical example of the invention, at least one support surface as a contact surface for the adjacent wafer is formed on the lateral wall of the wafer. In this way the relative positions of the wafers among each other and maintaining the gap dimensions in accordance with the claims are ensured.

An additional or alternative fixation of the wafers in the carrier part is possible in that the wafers are inserted in an upward direction with a press-fit in the carrier part.

The wafers in accordance with the invention are preferably manufactured by molding around the contact elements by injection molding.

The relative positions of the wafers among each other may be improved by formation of a lid.

Further advantageous developments of the invention are subject matters of the further subclaims.

BRIEF DESCRIPTION OF THE DRAWINGS

In the following, preferred practical examples of the invention shall be explained in more depth by referring to schematic drawings, wherein:

FIG. 1 shows a plug-in connector in accordance with the invention in three-dimensional representation;

FIG. 2 shows the plug-in connector attached on a circuit board in accordance with FIG. 1;

FIG. 3 is a three-dimensional representation of a wafer of the plug-in connector of FIG. 1;

DETAILED DESCRIPTION OF THE PREFERRED EMBODIMENTS

Figure 4:
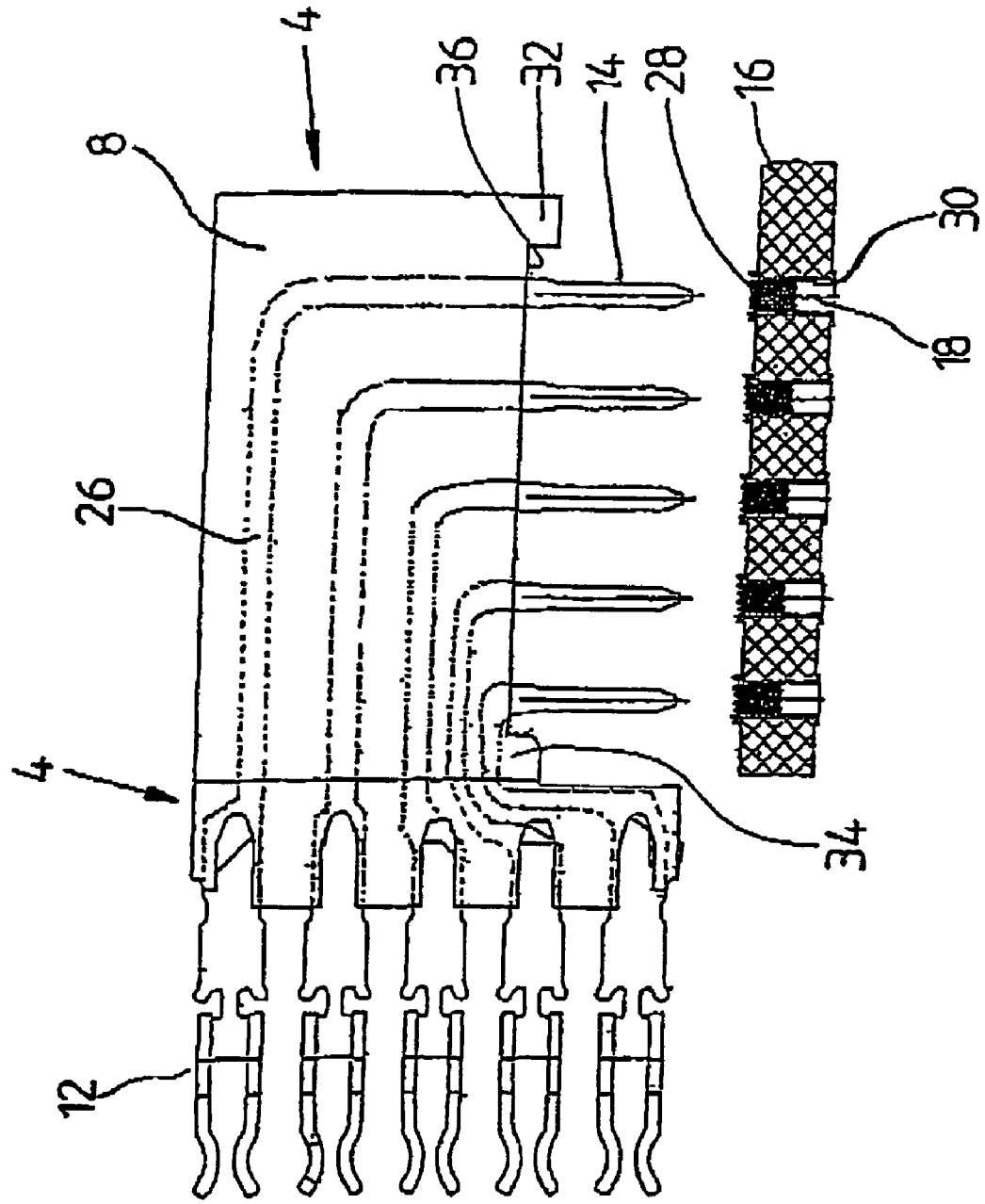
FIG. 4 is a lateral view of the wafers of FIG. 3 and a sectional view of a circuit board in accordance with FIG. 2.

FIG. 1 shows a simplified three-dimensional representation of a plug-in connector 1 in through-hole technology. This plug-in connector 1 has a carrier part 2 in which adjacently positioned wafers 4 are arranged. The carrier part 2 has recesses 6 wherein the wafers 4 are inserted by an end portion thereof. In accordance with FIG. 3 each wafer 4 includes an insulating material 8 wherein contact elements 10 are embedded. These extend through the insulating material 8 along the plane defined thereby, wherein in the representation in accordance with FIG. 3, in the horizontal direction flexible tongue-type contact terminals 12 and in a vertical downward direction soldering tags 14 offset at right angles to each other protrude from the insulating material 8. The contact terminals 12 with the adjacent end portion of the insulating material 8 are inserted in the recesses 6 of the carrier part 2.

Figure 5:
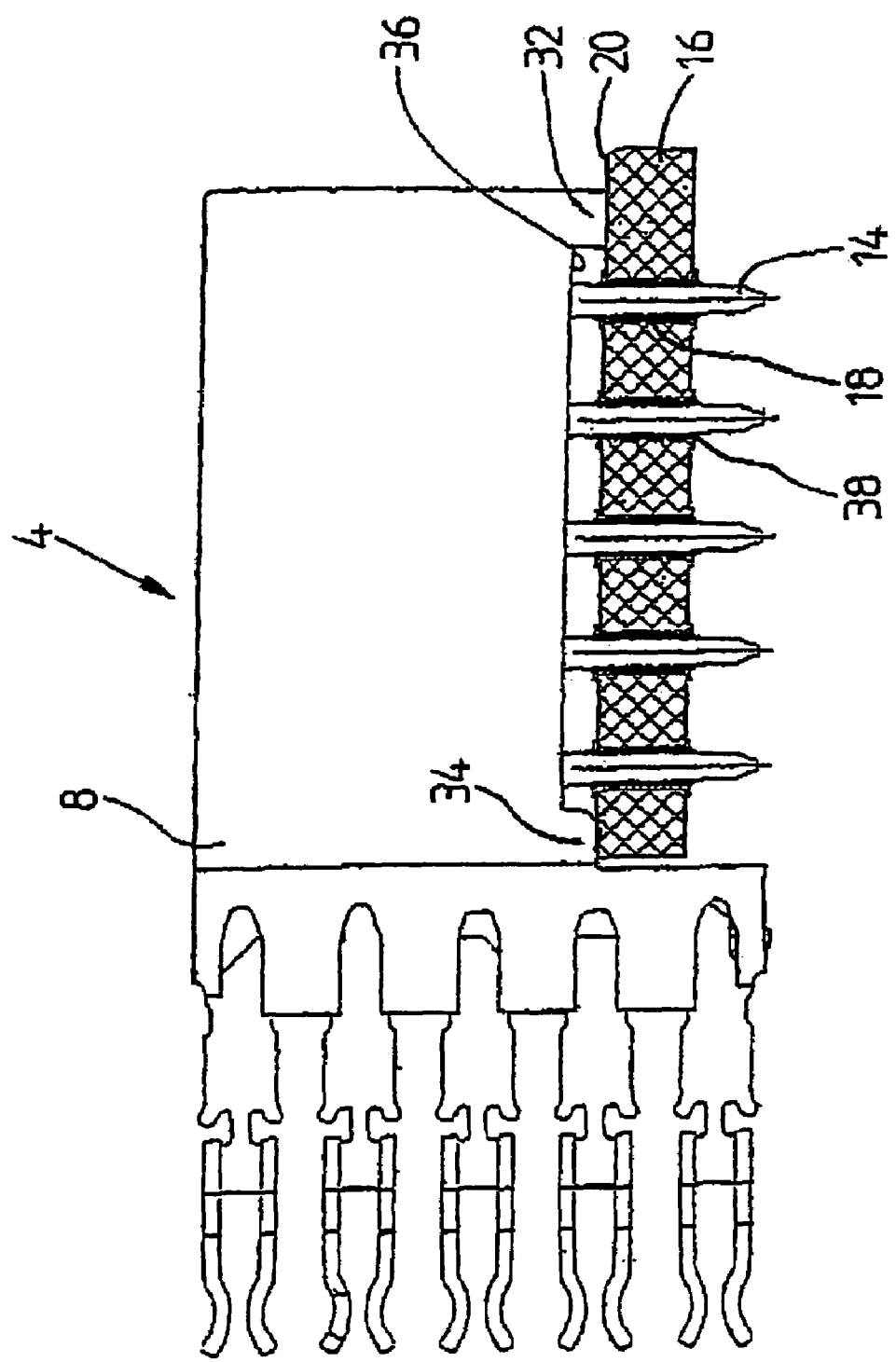
FIG. 5 shows the wafer of FIG. 4 in the condition connected to the circuit board by soldering.

In accordance with FIG. 2, the plug-in connector 1 formed with a multiplicity of wafers 4 is soldered to a circuit board 16 having a multiplicity of feedthroughs 18 into which the soldering tags 14 plunge in the mounted condition (this shall be explained more clearly by reference to FIGS. 4 and 5). The plug-in connector 1 and the circuit board 16 are formed such that in the assembled condition the wafers 4 have a predetermined relative position with regard to the circuit board surface 20. In this relative position there remains between the circuit boards a gap 22 having a gap width b (FIG. 1). Spacing of the wafers 4 relative to each other is defined in the practical example represented in FIGS. 1 to 3 by the distance of the recesses 6 in the carrier part 2 on the one hand and by lateral support surfaces 24 on the other hand. These support surface 24 are, e.g., each formed on the lateral wall of the insulating material 8 visible in FIG. 3, so that the adjacent lateral wall—not visible in FIG. 3—of the adjacent wafer 4 contacts this support surface 24. In principle, the support surfaces 24 may also be formed on either side on the insulating material 8, so that in the assembled condition support surfaces contact each other. The support surfaces 24 moreover act in accordance with FIG. 1 as insertion stops limiting the depth of insertion of the wafers 4 in the recesses 6 of the carrier part 2.

FIG. 4 shows an enlarged lateral view of the wafer of FIG. 3 and a sectional view of the range of the circuit board 16 to which the represented wafer is to be soldered. Accordingly, the contact terminals 12 and the soldering tags 14 are connected by contact paths 26 which are substantially surrounded by the insulating material 8. These contact paths 26 do not contact each other.

In the circuit board 16 the feedthroughs 18 are formed which are provided with solder paste 28. This feedthrough is a bore of the circuit board 16 that is thinly coated with conductive material 30. The solder paste 28 is made up of very small solder globules mixed with a sticky material that evaporates in heat.

In accordance with FIG. 4 two spacers 32 are formed on the insulating material 8, 34, between which spacers the soldering tags 14 extend. As a result of these two spacers 32, 34 a recess 36 in the insulating material 8 is formed whereby the ranges of the soldering tags 14 are exposed. FIG. 5 shows the platelets 4 in the condition soldered with the circuit board 16. The solder paste 28 is melted by the heat supplied through convection and radiation, and the liquid solder is sucked into the feedthrough 18 by capillary action. Cooling results in formation of the soldered joint 38 whereby one respective soldering tag 14 is mechanically and electrically connected in a reliable manner with the feedthrough 18.

In accordance with FIG. 5 the two spacers 32, 34 rest on the circuit board surface 20, so that the recess 36 creates a space through which portions of the soldering tags 14 extend freely. I.e., this recess 36 creates an additional space which, in co-operation with the gaps 22, may be utilized for heat transport. Heat transport along the recesses 36 takes place perpendicularly to the orientation of the wafers 4. By the gaps 22 and the recesses 36 an optimal heat transport to and from the feedthrough 18 is thus ensured, so that extremely rapid heating of the soldering location (feedthrough 18, soldering tag 14, solder paste 28) to soldering temperature, and also rapid solidification of the soldering location after soldering is ensured.

Figure 6:
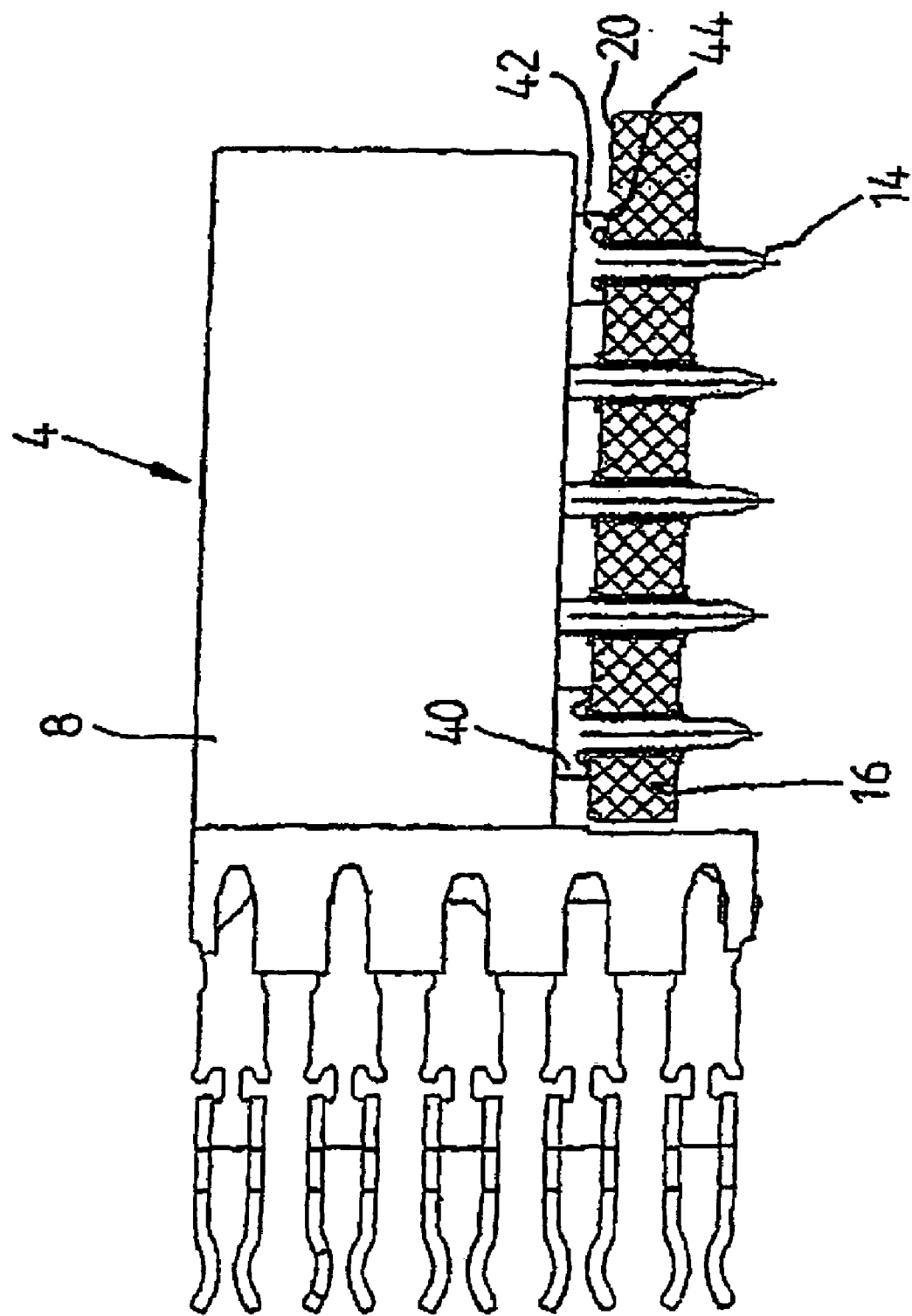
FIG. 6 shows another practical example of a wafer in the soldered condition.

FIG. 6 shows a practical example wherein the flow space for the heat transport medium (e.g., air) is constituted not by two spacers 36, 34 formed integrally with the insulating material 8, but by enlargements 40, 42 of the soldering tags 14. These enlargements 40, 42 are formed such that the lower edge of the insulating material 8 is again formed at a distance from the circuit board surface 20, with these enlargements 40, 42 resting on the circuit board surface 20 via support points 44. These enlargements 40, 42 and the support areas are designed such that the heat transport medium may unimpededly penetrate to the soldering location. In the practical example represented in FIG. 6, two of the soldering tags 14 were embodied with enlargements 40 and 42, respectively. In principle it may also be sufficient if only one enlargement 42 or one stop 32 is formed at the projecting portion of the wafers 4.

Figure 7:
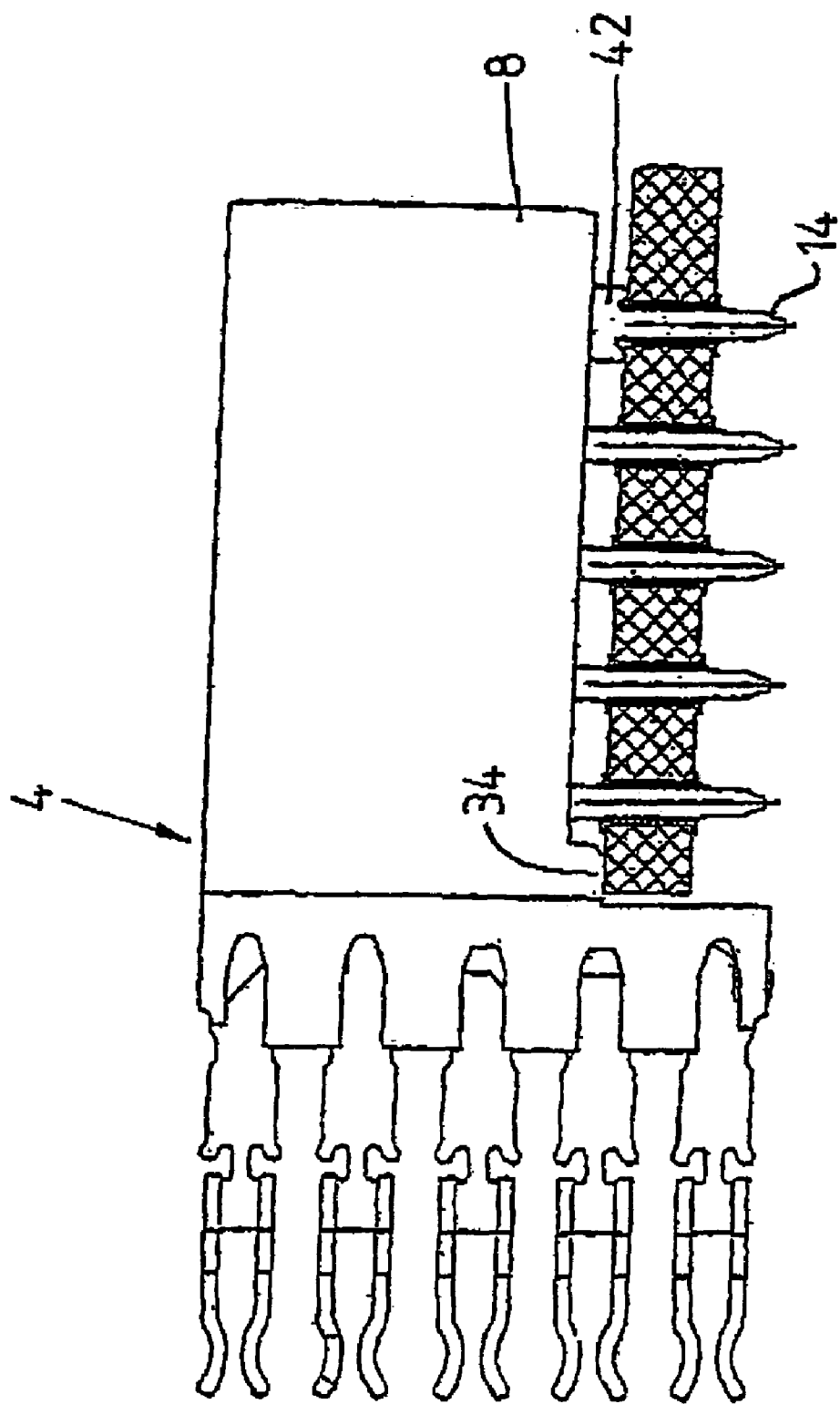
FIG. 7 shows a third practical example of a wafer in the soldered condition.

FIG. 7 shows an alternative embodiment wherein the solutions represented in FIGS. 5 and 6 are combined. I.e., the space allowing for heat transport along the circuit board surface 20 is in this practical example formed by a spacer 34 and an enlargement 42 which jointly ensure that the soldering location will be accessible for the heat transport medium. For the rest, the practical example represented in FIG. 7 corresponds to the one of FIG. 5 or 6, so that further explanations are superfluous.

Figure 8:
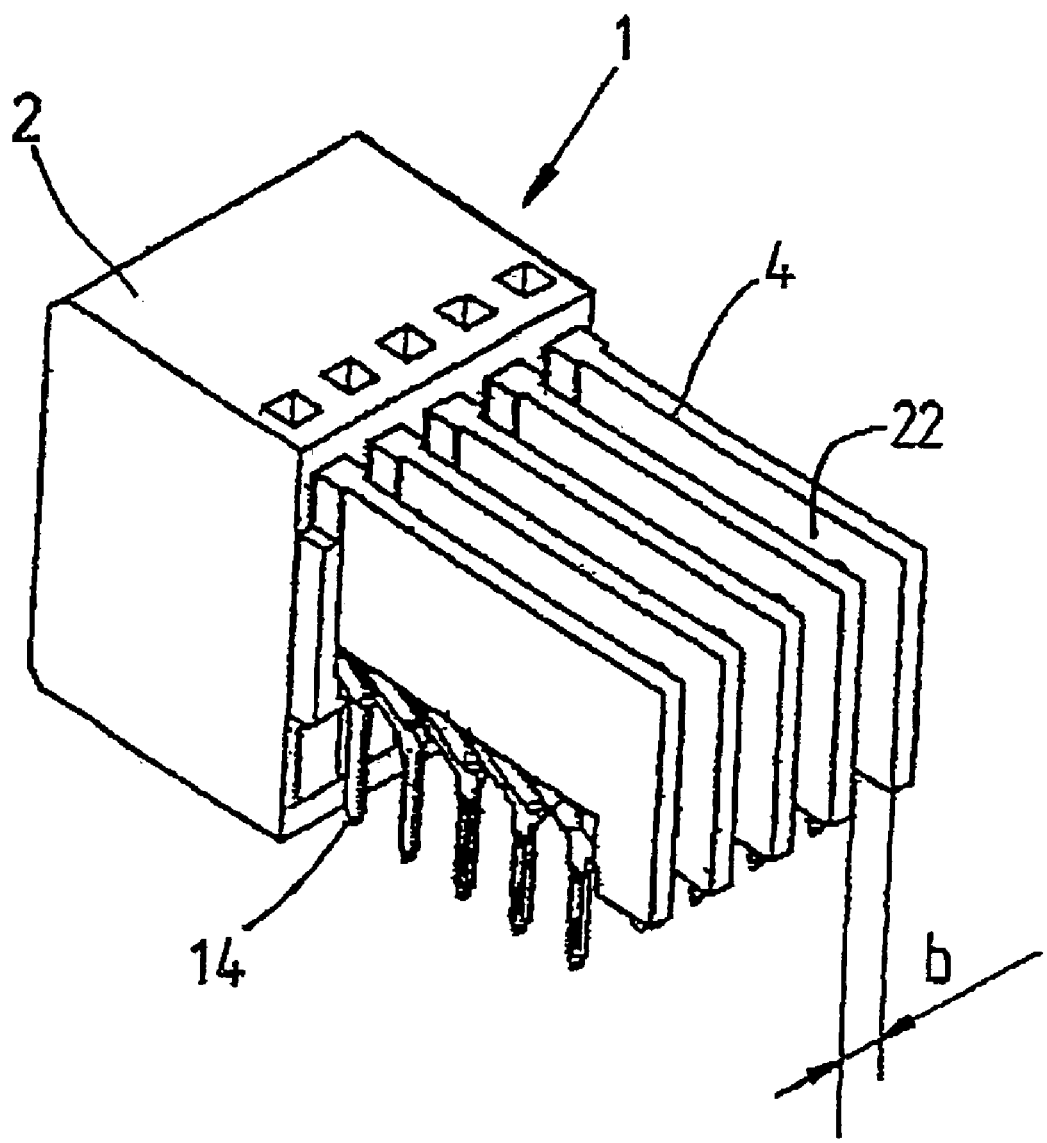
FIG. 8 shows another practical example of a plug-in connector in accordance with the invention.

In FIG. 8 another practical example of a plug-in connector 1 is represented. It has—like the above described practical examples—a carrier part 2 into which a multiplicity of wafer 4 are inserted. The soldering tags 14 of the plug-in connector 1 are inserted into the feedthroughs 18 of the circuit board 16 (cf. FIG. 9). Just like in the above described practical example, between two adjacent wafer 4 a respective gap 22 having a gap width b is formed, which permits unimpeded flow of the heat transport medium to the soldering location.

Figure 9:
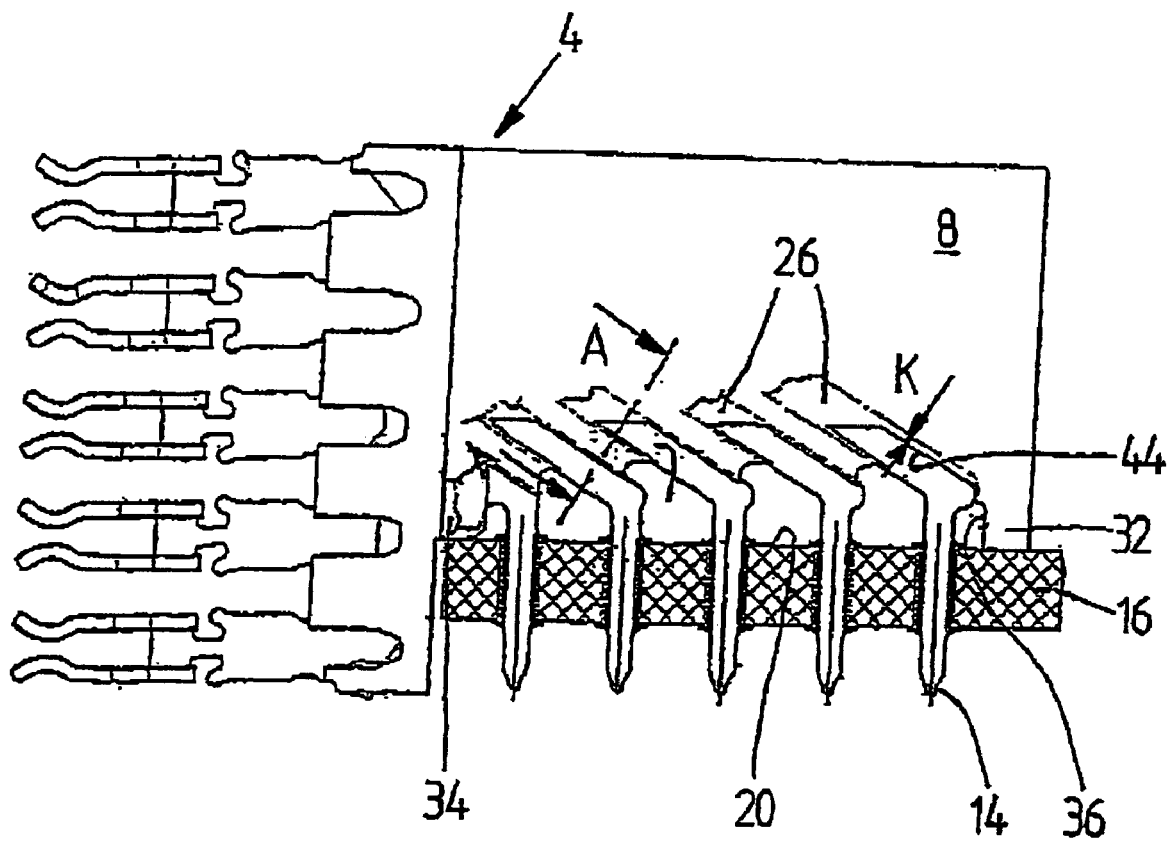
FIG. 9 shows a wafer of the plug-in connector of FIG. 8 in the soldered condition.

FIG. 9 shows a representation of a wafer 4 of the plug-in connector 1 of FIG. 8, which is soldered to the circuit board 16. Accordingly, the wafer 4—similar to the practical example represented in FIG. 5—has two spacers 32, 34 whereby the wafer 4 rests on the circuit board surface 20 in the soldered condition. Between the two spacers 32, 34 there is thus formed a recess 36 which allows for heat transport along the circuit board surface 20. Heat exchange is additionally improved in the practical example represented in FIG. 9 in that the insulating material 8 is provided with recesses 44 extending along the contact paths 26 indicated in dash-dotted line. As is indicated in FIG. 9, the recesses 44 are designed to be somewhat narrower than the contact paths, so that only a partial area is exposed. As a result of this measure, the range of the contact paths 26 adjoining the soldering tags 14 is partly exposed, so that these are accessible for the heat transport medium flowing along the gap 22 and the recess 36. I.e., by the partly recessed contact paths 26 the heat exchange area is enlarged, and heat transport to the soldering location is thus enhanced. The material of the insulating material 8 is located between the conduction paths 26 and covers the marginal area of the contact elements 10 over a width k (arrow in FIG. 9), so that these are reliably held in position.

Figure 10:
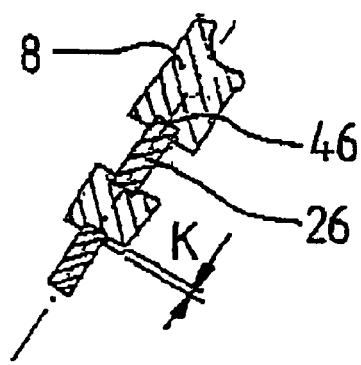
FIG. 10 is a sectional view along line A—A in FIG. 9.

As the contact elements 10 are thus immobilized, positioning inaccuracies of the soldering tags 14 relative to the circuit board 16 practically do not occur, so that pre-mounting of the plug-in connector on the circuit board 16 is simplified. In FIG. 10 a sectional view along line A—A is represented, illustrating how the insulating material 8 reaches around the peripheral edges 46 having a dimension k for positional fixation.

Figure 11:
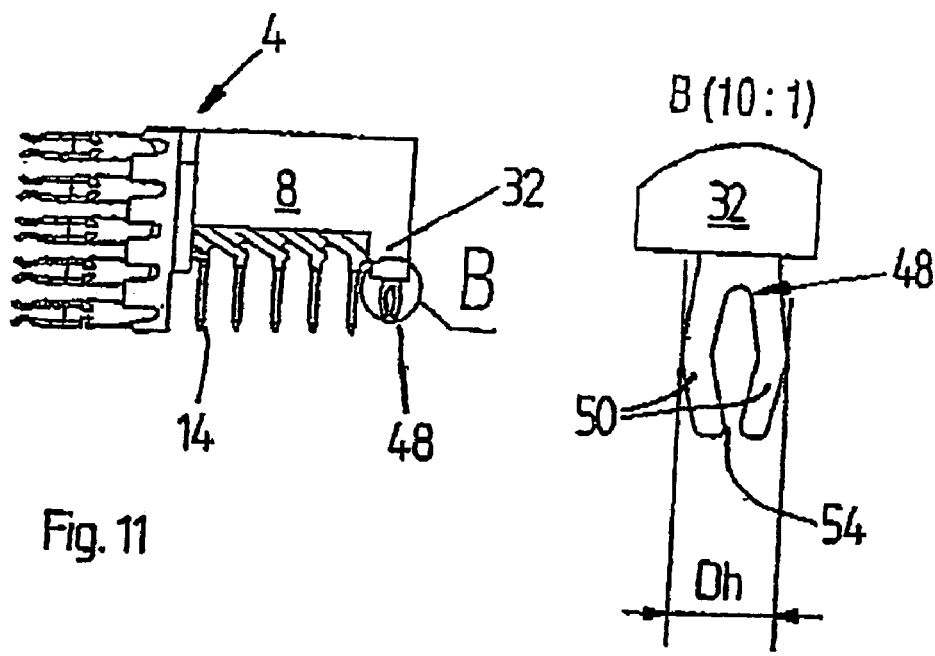
FIG. 11 shows a practical example of a wafer with a retainer member.

FIG. 11 shows a variant of the practical example represented in FIGS. 8 to 10. Accordingly, on the spacer 32 of the wafer 4 a retainer member 48 is formed which contributes to additional positional fixation in pre-mounting and during the soldering process. In accordance with the enlarged representation in FIG. 11, the retainer member 48 is formed by two fork portions 50 each having an approximately v-type curvature, wherein the two apices of the fork portions 50 are spaced apart by the dimension Dh. These fork portions 50 are made to be resilient so as to be elastically movable toward each other.

Figure 12:
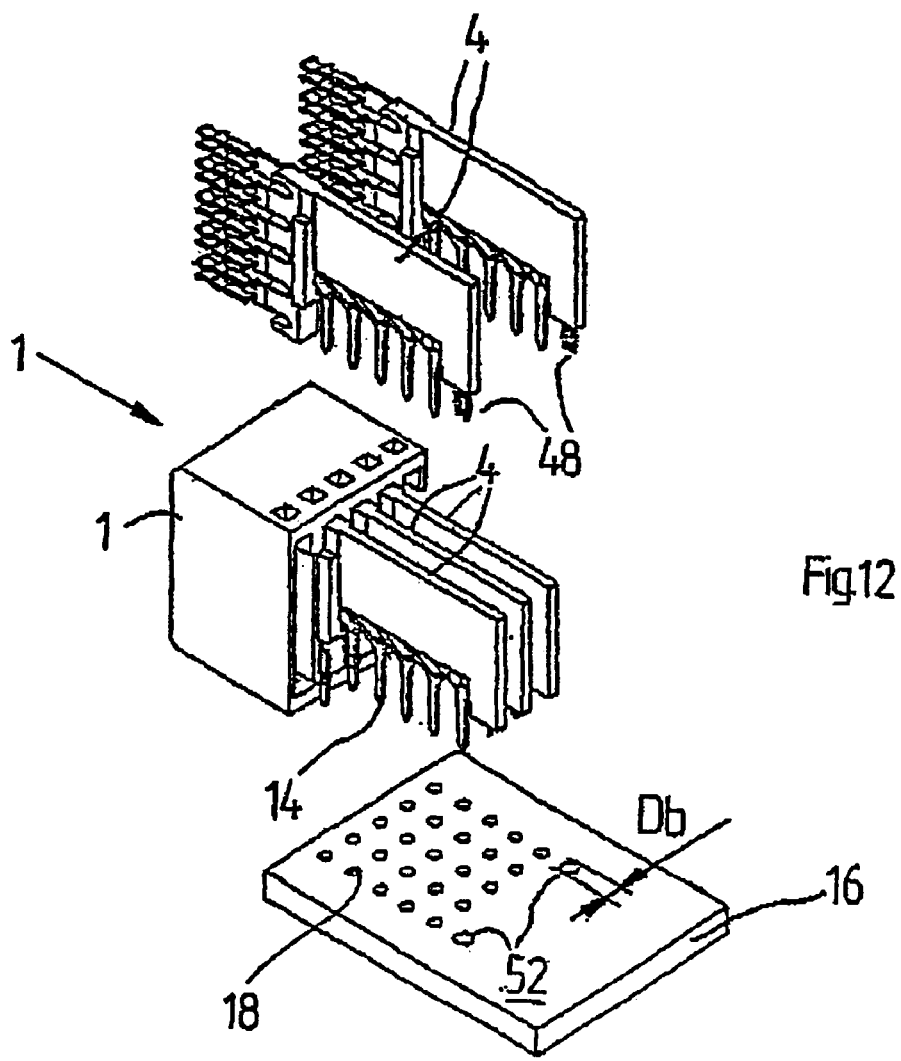
FIG. 12 shows three-dimensional representations of the plug-in connector in accordance with FIG. 8, of the wafers in accordance with FIG. 11, and a circuit board provided therefor.

In accordance with FIG. 12 there are formed in the circuit board 16 two retainer bores 52 whose diameter Db is smaller than the dimension Dh. In the represented practical example only the two external wafers 4 are designed with retainer members 48, so that correspondingly only two retainer bores 52 are provided in the circuit board 16. During setting in place of the plug-in connector 1, the two fork portions 50 of each retainer portion 48 plunge into the retainer bores 52. The fork portions 50 are elastically approached to each other until the external distance of the fork portions 50 corresponds to the dimension Db. Upon further insertion, the fork portions 50 snap into place behind the lower peripheral edges of the retainer bore 52, so that the plug-in connector 1 is immobilized. The resilient fork portions 50 can be approached toward each other until their ends 54 contact each other. In this contact position a resilience force is generated which is substantially higher than the spring force of the single spring members. Moreover the above described embodiment of the resilient fork portions 50 acts as a safety against breakage of the spring members, for no more elastic deformation results in the location of the highest mechanical stress (in the range of connection of fork portions 50) starting from the point in which the ends 54 contact each other, for subsequently the arc-shaped resilient elements are extended longitudinally.

Owing to the elastic deformation of the fork portions 50 there exists a contact force between the retainer bore 52 and the retainer member 48 perpendicularly to the axial direction of the bore and thus results in a retainer force acting in an axial direction, which force is high enough for immobilizing the plug-in connector on the circuit board for the period between pre-mounting and solidification of the soldered joint and for maintaining the orientation of the plug-in connector 1 relative to the circuit board 16. This precise orientation is a precondition for the functionality of a subassembly later on.

Figure 13:
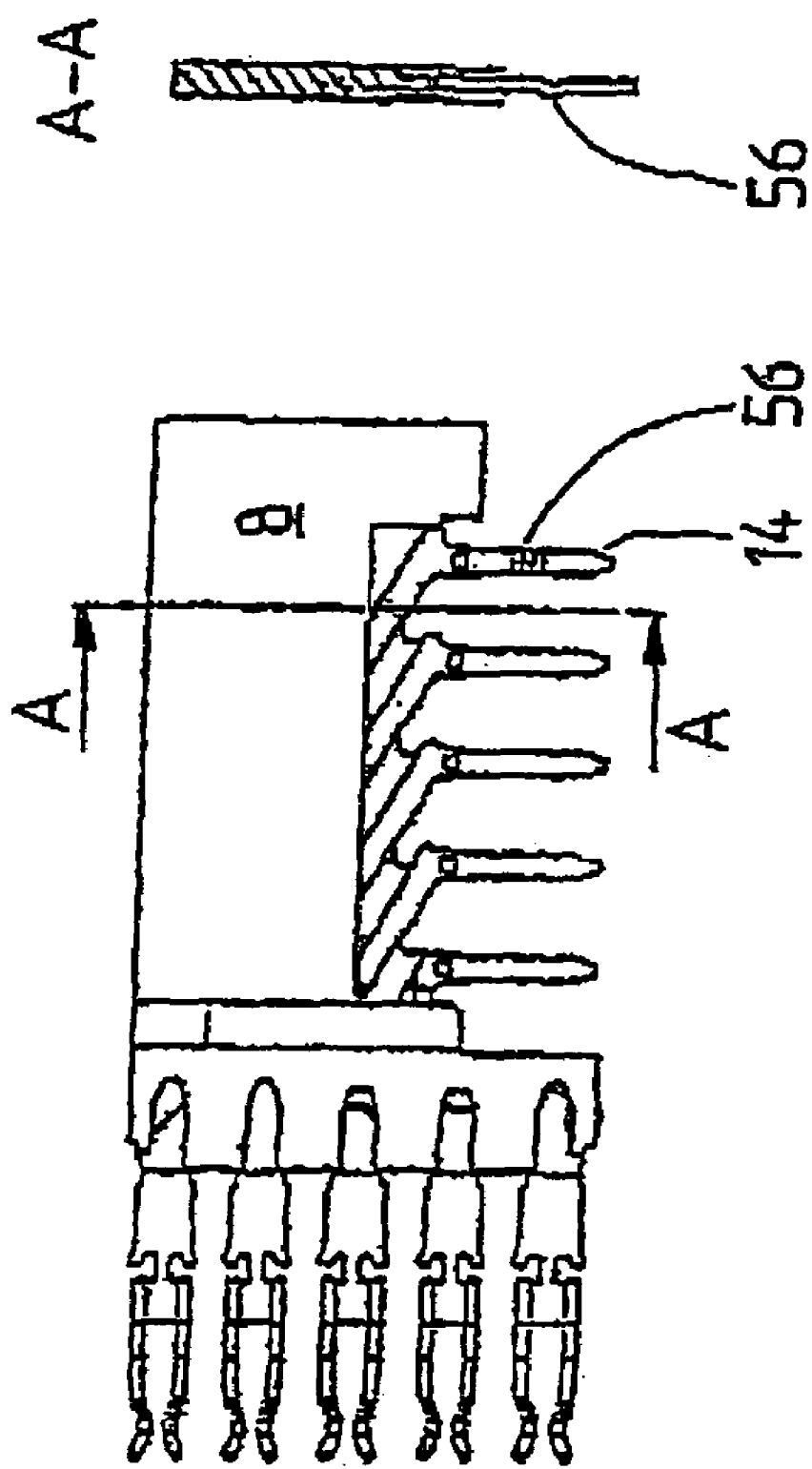
FIG. 13 shows another practical example of a wafer for a plug-in connector in accordance with the invention.

In FIG. 13 a practical example is represented wherein the positional fixation during pre-mounting and during solidification of the soldered joint is brought about not by additional retainer members 48 as in the above described practical example, but by a dent, e.g., of the outermost soldering tag 14 (on the right in FIG. 13). In the case of such a dent 56 the soldering tag 14 presents a convexity toward one side. Upon insertion of the dented soldering tag 14 in a feedthrough 18, the raised point of the soldering tag 14 contacts the adjacent side of the feedthrough 18—the soldering tag 14 is mechanically tensioned as it is bent sideways. The contact force applied to the feedthrough 18 in a radial direction by the dented soldering tag 14 is high enough for generating a retainer force acting in an axial direction, whereby the plug-in connector is sufficiently immobilized on the circuit board 16 in the time between pre-mounting and solidification of the soldered joint.

Figure 14:
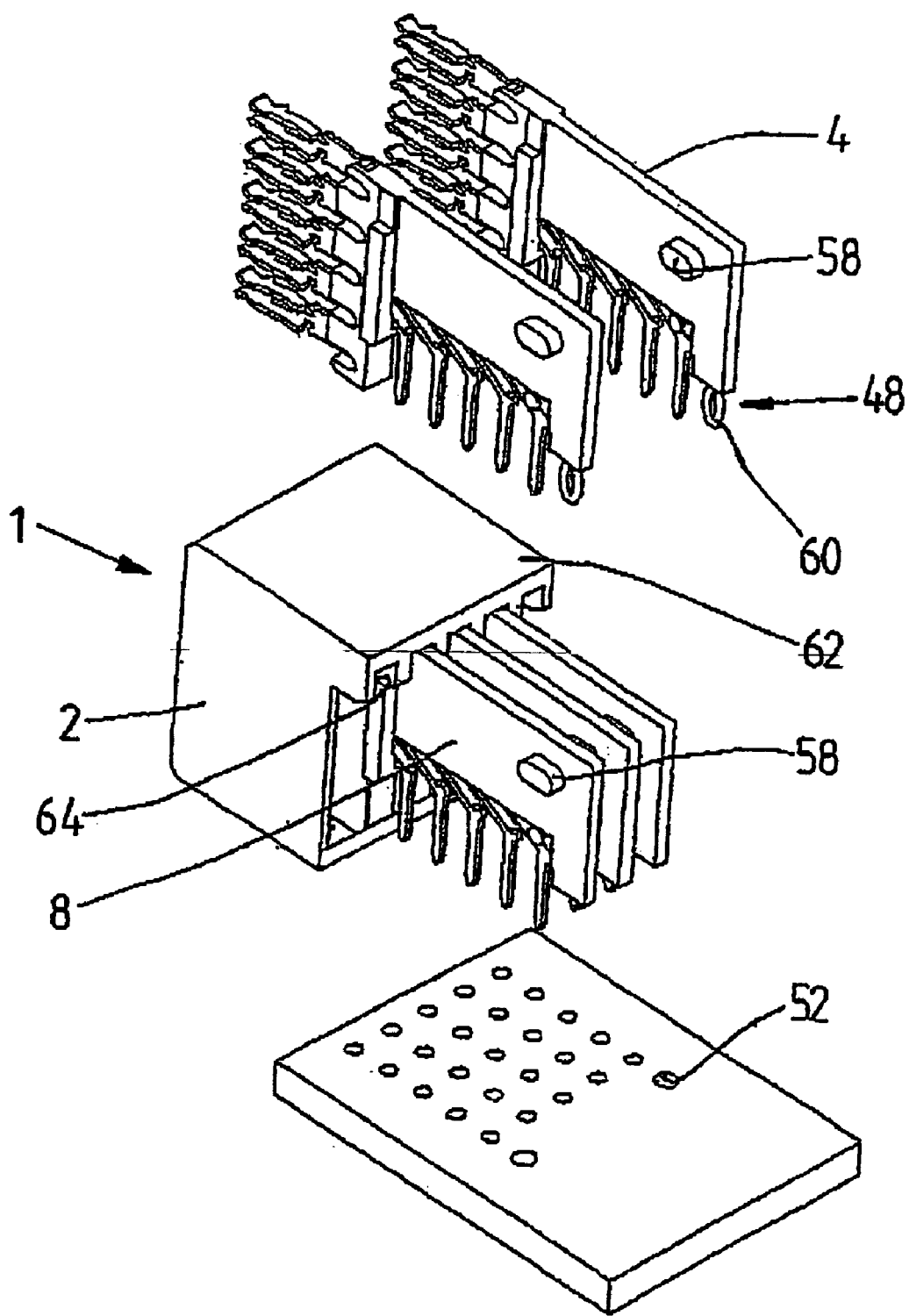
FIGS. 14 to 16 show variants of the practical examples described by reference to FIGS. 1 to 3.
Figure 15:
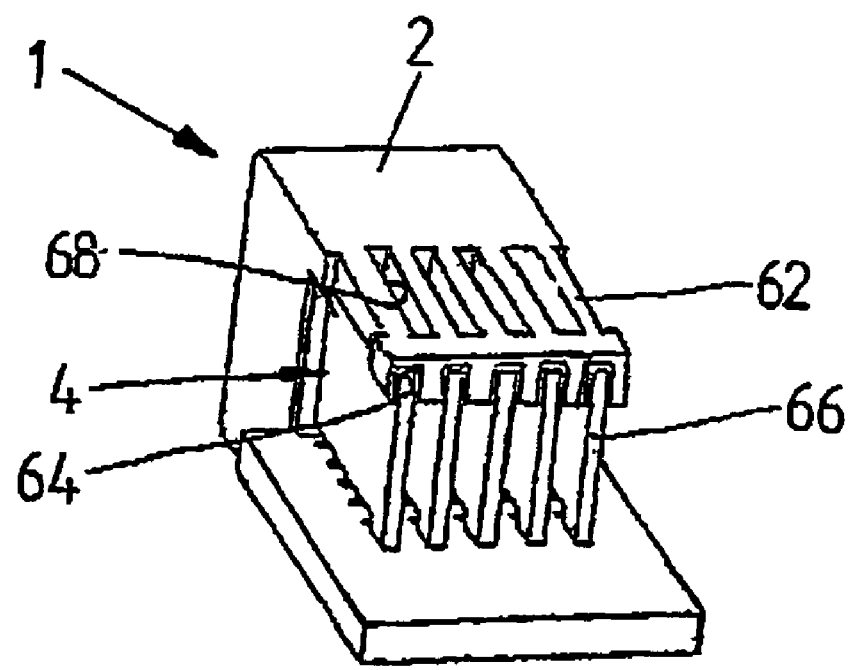
Figure 16:
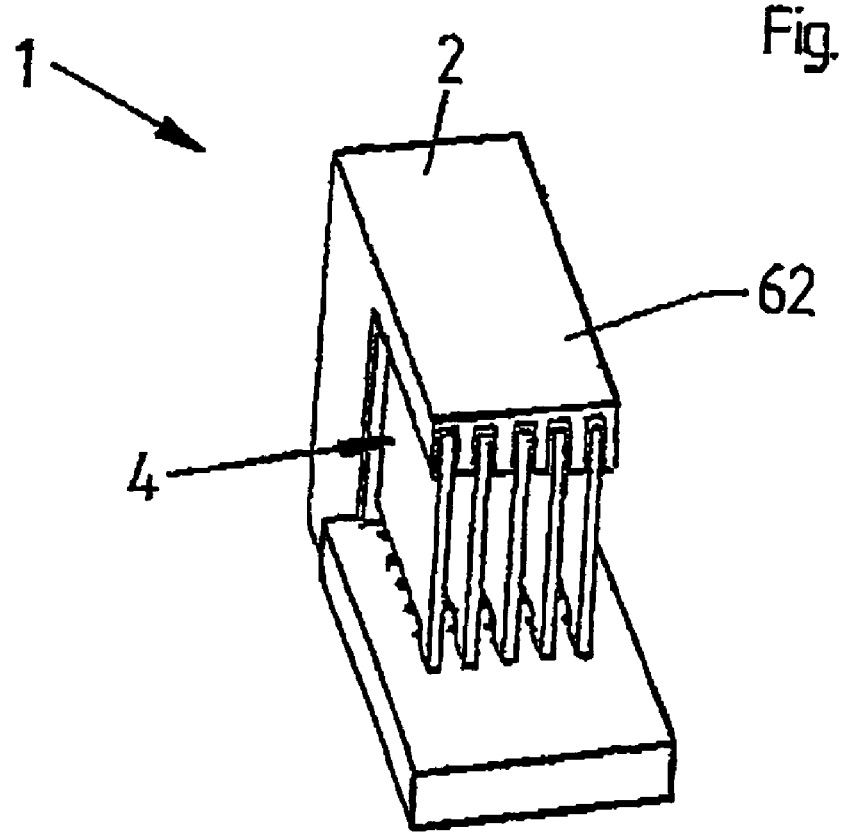

In FIGS. 14 to 16 further variants of the above described plug-in connector 1 are represented, wherein guidance of the wafers 4 is improved.

FIG. 14 shows a variant wherein on the lateral surfaces of the insulating material 8 laterally arranged projections 58 are formed, whereby the wafers are spaced apart in the assembled position. These projections 58 may be injection molded to the insulating material. The wafers 4 represented in FIG. 14 moreover have—similar to the practical example represented in FIGS. 11 and 12—retainer members 48 which do, however, have the form not of a fork portion but of a closed, approximately elliptical presser ring 60. This presser ring 60 plunges into the retainer bore 52 when the wafer 4 is inserted, with the lateral portions of the presser ring 60 being deformed radially to the inside, so that the wafer 4 is immobilized in the retainer bore 52 with a high strength due to excessive pressure. In this press-fit position the wafers 4 are spaced apart from each other by the lateral projections 58 and the support surfaces 24, so that an extremely accurate parallel orientation with the gap dimension b is ensured. Due to the closed shape of the retainer members, higher retaining forces are achieved than with the open shape in accordance with FIG. 11, so that the clamping effect is improved.

In the practical example represented in FIG. 14 moreover a lid 62 is injection molded to the carrier part 2, which lid protrudes from carrier part 2 in a roof shape and covers the wafers 4 in portions thereof. In this lid 62 guide grooves 64 are formed which reach around the adjacent peripheral edges of the insulating material 8 of the wafers, so that parallel guidance is further improved.

FIG. 15 shows a variant wherein the lid 62 is prolonged, in comparison with the solution represented In FIG. 14, as far as the front edges of the wafers 4 to thus cover the latter almost completely. For better cooling, cooling slots 68 are formed in the lid 62, which cooling slots are oriented between two adjacent wafer 4 in relation to the gaps. This lid 62, too, has guide grooves 64 for the wafers 4.

FIG. 16 finally shows a simplified variant of the practical example represented in FIG. 15, wherein the lid 62 is designed without cooling slots 68.

In principle, the lid constructions represented in FIGS. 14, 15 and 16 may be employed in all of the above described practical examples. The lid may be designed to be integral with the carrier part 2 or, however, as an additional component.

What is disclosed is a plug-in connector in through-hole technology that is suited for the surface soldering technique. The plug-in connector includes an insulating carrier part wherein a multiplicity of wafers each having soldering tags and contact terminals are inserted. In accordance with the invention, the wafers are placed at a distance from each other, whereby flow channels for supplying the heat transport medium, e.g. air, are created. In an advantageous alternative or additional development of the invention, there is formed in the range of the feedthrough a flow space permitting a flow of the heat transport medium perpendicularly to the plane of the platelets. This passage may be formed by a recess of the insulating material or by suitable spacer elements.

What is claimed is:

1. A plug-in connector including an insulating carrier part wherein a multiplicity of wafers arranged side by side are inserted, each having contact elements with contact terminals and soldering tags and portions of which are embedded in an insulating material wherein said soldering tags may be soldered to feedthroughs or conduction paths of an electrical circuit such as of a circuit board, characterized in that between two adjacent wafers a respective gap is formed substantially at a fixed end of said soldering tags;

wherein said wafers have spacers substantially at said feedthroughs, so that said contact elements freely extend between said insulating material and said electrical circuitry; and wherein said insulating material has recesses which extend along said contact elements and expose portions thereof.

2. A plug-in connector according to claim 1, wherein said spacers are formed on said insulating material or on said contact elements.

3. A plug-in connector according to claim 1, wherein said recesses are designed such that peripheral edges of said contact elements are encompassed along a dimension (k).

4. A plug-in connector according to claim 1, wherein on a lateral wall of said wafer protruding support surfaces are formed which act as a contact surface for an adjacent wafer.

5. A plug-in connector according to claim 1, wherein said insulating material of said wafers is inserted into said carrier part in a press-fit in an upward direction.

6. A plug-in connector according to claim 1, wherein said wafers are produced by molding around said contact elements in the injection molding.

7. A plug-in connector according to claim 1, wherein said spacers are on opposed sides of at least one of said soldering tags.

8. A plug-in connector according to claim 1, wherein said wafer has a retainer member capable of being taken into engagement with a correspondingly shaped mating part of said electrical circuitry.

9. A plug-in connector according to claim 8, wherein said retainer member is a dent of a soldering tag which is in frictional engagement in an associated feedthrough.

10. A plug-in connector according to claim 8, wherein said retainer member is a spring member which snaps into a retainer bore of said electrical circuitry.

11. A plug-in connector according to claim 10, wherein said spring member is formed integrally with said insulating material.

12. A plug-in connector according to claim 1, including a lid covering said wafers at least in portions thereof.

13. A plug in connector according to claim 12, wherein said lid is fastened on said carrier part and either covers said wafer in portions thereof, or formed with slots aligned with said gaps between said wafers.

* * * * *